(12) United States Patent
Hiura et al.

(10) Patent No.: US 8,835,286 B2
(45) Date of Patent: Sep. 16, 2014

(54) MANUFACTURING METHOD OF GRAPHENE SUBSTRATE AND GRAPHENE SUBSTRATE

(75) Inventors: Hidefumi Hiura, Tokyo (JP); Kazuhito Tsukagoshi, Ibaraki (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/882,317

(22) PCT Filed: Nov. 2, 2011

(86) PCT No.: PCT/JP2011/075883
§ 371 (c)(1),
(2), (4) Date: Apr. 29, 2013

(87) PCT Pub. No.: WO2012/060468
PCT Pub. Date: May 10, 2012

(65) Prior Publication Data
US 2013/0214253 A1    Aug. 22, 2013

(30) Foreign Application Priority Data

Nov. 4, 2010 (JP) ................................. 2010-247122

(51) Int. Cl.
| H01L 21/20 | (2006.01) |
| H01L 21/36 | (2006.01) |
| C01B 31/04 | (2006.01) |
| H01L 21/02 | (2006.01) |
| H01L 29/16 | (2006.01) |

(52) U.S. Cl.
CPC ...... H01L 21/02376 (2013.01); C01B 31/0446 (2013.01); H01L 29/1606 (2013.01)
USPC ................. 438/478; 438/509; 257/9; 257/29

(58) Field of Classification Search
CPC .................. H01L 21/02376; H01L 21/02444; H01L 29/1606
USPC .................................. 438/478, 509; 257/9, 29
See application file for complete search history.

(56) References Cited

U.S. PATENT DOCUMENTS 7,947,581 B2 * 5/2011 Ma ................. 438/509
2009/0110627 A1   4/2009 Choi et al.

FOREIGN PATENT DOCUMENTS

| JP | 2009-107921 A | 5/2009 |
| JP | 2010-37128 A | 2/2010 |

(Continued)

OTHER PUBLICATIONS

Weijie Lu, et al., "Growth of Graphene-Like Structures on an Oxidized SiC Surface", Journal of Electronic Materials, Jun. 2009, pp. 731-736, vol. 38, No. 6.

(Continued)

*Primary Examiner* — Tu-Tu Ho
(74) *Attorney, Agent, or Firm* — Sughrue Mion, PLLC

(57) ABSTRACT

The invention provides a manufacturing method of a graphene-on-insulator substrate which is mass productive, of high quality, and yet is directly usable for manufacture of semiconductor devices at a low manufacturing cost. According to the manufacturing method of a graphene substrate of the invention, a metal layer and a carbide layer are heated with the metal layer in contact with the carbide layer so that carbon in the carbide layer is dissolved into the metal layer, and then the metal layer and the carbide layer are cooled so that the carbon in the metal layer is segregated as graphene on the surface of the carbide layer.

16 Claims, 10 Drawing Sheets

(56) References Cited

FOREIGN PATENT DOCUMENTS

| | | |
|---|---|---|
| JP | 2010-89996 A | 4/2010 |
| WO | 2010/023934 A1 | 3/2010 |
| WO | 2010/122928 A1 | 10/2010 |

OTHER PUBLICATIONS

Tsuneya Ando, "The electronic properties of graphene and carbon nanotubes", NPG Asia Materials, 2009, pp. 17-21, vol. 1, No. 1.

K.S. Novoselov, et al., "Two-dimensional atomic crystals", PNAS, Jul. 26, 2005, pp. 10451-10453, vol. 102, No. 30.

Xuesong Li, et al., "Large-Area Synthesis of High-Quality and Uniform Graphene Films on Copper Foils", Science, 2009, pp. 1312-1314, vol. 324.

M. Kusunoki, "A formation mechanism of carbon nanotube films on SiC(0001)", Applied Physics Letters, 2000, pp. 531-533, vol. 77, No. 4.

Jun-Ichi Fujita, "Graphitization at interface between amorphous carbon and liquid gallium for fabricating large area graphene sheets", J. Vac. Sci. Tech. B 27(6), Nov./Dec. 2009, pp. 3063-3066, vol. 77, No. 4.

* cited by examiner (a)

(b)

(c)

MANUFACTURING METHOD OF GRAPHENE SUBSTRATE AND GRAPHENE SUBSTRATE

CROSS REFERENCE TO RELATED APPLICATIONS

This application is a National Stage of International Application No. PCT/JP2011/075883, filed on Nov. 2, 2011, which claims priority from Japanese Patent Application No. 2010-247122, filed on Nov. 4, 2010, the contents of all of which are incorporated herein by reference in their entirety.

BACKGROUND ART

This invention relates to a manufacturing method of a graphene substrate and a graphene substrate manufactured by this method. The invention particularly relates to a manufacturing method of a graphene substrate, and a graphene substrate applicable to next-generation electronics, opto-electronics, and spintronics due to its exceptional electronic and optical properties, and excellent mechanical and chemical properties.

The information-oriented society now we see is supported by semiconductor devices represented by silicon-based CMOS (Complementary Metal Oxide Semiconductor) devices. Silicon semiconductor industries have heretofore achieved miniaturization by continuously reducing the size range to which microprocessing techniques such as lithography, etching, and deposition techniques are applied, from micrometers to several tens of nanometers, and thus have realized both high-scale integration and high performance. However, in recent years, thicknesses of silicon layers serving as semiconductor channels have become as small as the level of atomic layers. It is now pointed out that silicon is facing its limit as a material and its physical limit.

Graphene, which is an ultimately thin two-dimensional atomic layer film but is chemically and thermodynamically stable, is a novel semiconductor material possessing high potential to meet the requirements described above. Utilization of excellent properties of graphene may bring a possibility to realize new devices having superior performance exceeding that of existing devices.

Graphene is one single layer taken from graphite which is a layered material made only of $sp^2$ hybrid carbon. As mentioned in the above, graphene is a single-atomic-layer planar material which is very robust to chemical reactions and stable thermodynamically. The graphene comprises a structure of a honeycomb like (pseudo) two-dimensional sheet in which regular six-membered rings with carbon atoms at the apexes are tightly arranged with no space therebetween. The carbon-to-carbon distance is about 1.42 angstroms (0.142 nm), and the thickness of the layer is 3.3 to 3.4 angstroms (0.33 to 0.34 nm) when it is on an underlying layer of graphite, whereas is about 10 angstroms (1 nm) when it is on any other substrate.

A plane of graphene may assume various sizes. A length on one side may vary from a molecular size of nanometer order up to theoretically infinity. While graphene in general comprises a single layer structure, while it often comprises two or more layers. Graphenes of a single layer, two layers, and three layers are called monolayer graphene, bilayer graphene, and trilayer graphene, respectively, and graphenes of up to about ten layers are collectively called few-layer graphene. All the graphenes except single-layer graphene are called multilayer graphene.

The electronic state of graphene can be described by a Dirac equation in its low-energy region as described in Ando, "The electronic properties of graphene and carbon nanotubus", NPG Asia Materials 1(1), 2009, p 17-21 (Non-Patent Document 1). In this regard, graphene is in marked contrast with other materials than graphene, which are described well by Schrodinger equations.

Electronic energy of graphene has a linear dispersion relation with wavenumber in the vicinity of K point. More specifically, electronic energy of graphene can be represented by two straight lines with positive and negative gradients corresponding to a conduction band and a valence band. The point where these lines intersect is called Dirac point, at which graphene exhibits peculiar electronic properties that electrons of graphene behave as fermions with an effective mass of zero. Due to this, graphene has a mobility of $10^7\,cm^2V^{-1}s^{-1}$ or more, that is the highest of all the existing materials, and yet has low dependence on temperature.

Single-layer graphene is basically a metal or semimetal with a bandgap of zero. However, when the size becomes nanometer order, the bandgap is generated, and a semiconductor is produced having a finite bandgap depending on the width and edge structure of the graphene. Bilayer graphene exhibits a bandgap of zero when there is no perturbation, whereas when such perturbation as to break mirror symmetry between the two graphene layers, for example, an electric field is applied to the graphene, it exhibits a finite gap according to the magnitude of the electric field.

For example, a gap of about 0.25 eV is generated in an electric field of $3V\,nm^{-1}$. Trilayer graphene exhibits metallic electronic properties in which a conduction band and a valence band overlap with each other by a width of about 30 meV. Thus, the trilayer graphene is close to bulk graphite in terms of the fact that the conduction band and the valence band overlap with each other. Graphene of four or more layers also exhibits metallic properties, and the properties gradually approach to electronic properties of bulk graphite as the number of layers increases.

Graphene is excellent in mechanical properties as well, and the Young's modulus of one layer of graphene is as high as 2 TPa (terapascals). The tensile strength of graphene is the highest of all the existing materials.

In addition, graphene has peculiar optical properties. For example, in a wide electromagnetic wave range from ultraviolet range (wavelength of 200 nm or less) to terahertz near range (wavelength of 300 μm or less), the transmissivity of graphene is represented by 1-nα (where n denotes a number of layers of graphene, that is equal to about 1 to 10, α denotes a fine-structure constant, that is represented by $\alpha=e^2/2hc\epsilon_0=0.0229253012$, where e denotes an elementary electric charge, h denotes a Planck's constant, and c denotes a dielectric constant of vacuum). Thus, graphene is represented only by fundamental physical constants, but not by material constant of graphene. This is the feature peculiar to graphene that is not found in any other materials.

Further, the transmissivity and reflectivity of graphene exhibit dependence on carrier density in terahertz spectral region. This means that the optical properties of graphene can be controlled based on electric field effect. It is known that other two-dimensional atomic layer thin films also have peculiar properties based on dimensionality.

Having exceptional electronic and optical properties and excellent mechanical and chemical properties as described above, graphene is expected to be used in a variety of industries from chemical to electronic industries. The fields of application of graphene are being expanded in various countries in the world, and graphene is being used for semiconductor devices and micro mechanical devices in the fields of next-generation electronics, spintronics, opto-electronics, micro/nanomechanics, and bioelectronics. For other two-dimensional atomic layer thin films as well as graphene, researches and developments are actively carried out for the purpose of industrially utilizing them.

When graphene is used for a channel of a field effect transistor (FET) or any other semiconductor device, a substrate for supporting the graphene (graphene substrate) is required.

A graphene substrate has conventionally been manufactured by the following four manufacturing methods:

(1) manufacturing method by peeling (see, for example, K. S. Novoselov, D. Jiang, F. Schedin, T. J. Booth, V. V. Khotkevich, S. V. Morozov, and A. K. Geim, "Two-dimensional atomic crystals", PNAS, 102(30), 2005, p 10451-10453 (Non-Patent Document 2));

(2) manufacturing method by CVD (Chemical Vapor Deposition), (see, for example, Xuesong Li, Weiwei Cai, Jinho An, Seyoung Kim, Junghyo Nah, Dongxing Yang, Richard Piner, Aruna Velamakanni, Inhwa Jung, Emanuel Tutuc, Sanjay K. Banerjee, Luigi Colombo, and Rodney S. Ruoff, "Large-Area Synthesis of High-Quality and Uniform Graphene Films on Copper Foils", Science, Vol. 324, 2009, p 1312-1314 (Non-Patent Document 3));

(3) manufacturing method by thermal decomposition of silicon carbide (SiC) (see, for example, M. Kusunoki, T. Suzuki, T. Hirayama, N. Shibata, and K. Kaneko, "A formation mechanism of carbon nanotube films on SiC (0001)", Applied Physics Letters, Vol. 77 (4), 2000, p 531-533 (Non-Patent Document 4)); and (4) manufacturing method by interface growth between gallium and amorphous carbon (see, for example, JP 2010-037128A (Patent Document 1) and Fujita, Ueki, Miyazawa, and Ichihashi, "Graphitization at interface between amorphous carbon and liquid gallium for fabricating large area graphene sheets", Journal of Vacuum Science & Technology. Second series. B, vol. 77 (4), 2006, p 3063-3066 (Non-Patent Document 5)).

The manufacturing method by peeling of (1) is a method in which graphite and graphene pieces are peeled from graphite crystals such as natural graphite or highly oriented pyrolytic graphite (HOPG) with adhesive tape and pasted on a substrate.

The manufacturing method by CVD of (2) is a method in which a hydrocarbon such as methane is thermally decomposed or plasma decompose on a substrate comprising a metal catalyst segregated thereon or on a foil serving as a metal catalyst to grow graphene, and then the unnecessary metal catalyst is removed with acid or the like and the graphene is transferred onto another substrate.

The manufacturing method by thermal decomposition of silicon carbide (SiC) of (3) is a method in which graphene is grown by heat treating a SiC substrate at a high temperature (up to 1600° C.) to cause carbon atoms to aggregate on the substrate while evaporating silicon atoms from the surface of the substrate.

The manufacturing method by interface growth between gallium and amorphous carbon of (4) is a method in which a liquid gallium layer is brought into contact from above with an amorphous carbon layer segregated on a substrate at a high temperature (up to 1000° C.), so that graphene is grown on the amorphous carbon by interface reaction, and a composite layer consisting of a gallium layer, a graphene layer, and an amorphous carbon layer is transferred onto another substrate, and gallium is dissolved with acid to obtain a composite layer consisting of a graphene layer and an amorphous carbon layer. According to this method of (4), the layers are arranged, after one transfer process, in the sequence of the amorphous carbon layer, the graphene layer, and the substrate. In order to form graphene in the uppermost layer to meet the necessity in fabrication of the device, that is, in order to form the layers in the sequence of the graphene layer, the amorphous layer, and the substrate, one more transfer process, and hence two transfer processes in total must be performed.

DISCLOSURE OF THE INVENTION

However, the abovementioned conventional methods of manufacturing graphene substrate have problems as described below.

First, the manufacturing method by peeling of (1) has a problem that mass production is difficult.

Second, the manufacturing method by CVD of (2) has a problem that quality degradation may occur due to failure or introduction of impurity during transfer of graphene. Further, since explosive hydrogen gas is used for reduction of the metal surface, additional cost is required for explosion protection or the like.

Third, according to the manufacturing method by thermal decomposition of silicon carbide (SiC) of (3), in which SiC thermal decomposition graphene is manufactured, an intermediate layer that possibly deteriorates the properties of graphene is inserted between the graphene and the top layer of the SiC substrate. Therefore, the graphene substrate thus manufactured is generally of a low quality. When the off-angle of the SiC substrate is zero, quality degradation of graphene may occur due to roughening (rough surface). This imposes a restriction on selection of substrates that an inclined substrate (having an off-angle of 3.5 to 8 degrees) must be used to prevent the roughening. Further, a SiC substrate used in this method must be pretreated with hydrogen plasma. Furthermore, silane gas processing is required to promote desorption of silicon, and a high temperature of 1400 to 1600° C. is used for SiC thermal decomposition, which requires special equipment for this purpose. Therefore, this method has a problem that additional cost is required for installing a special gas system, a high temperature system and the like.

Fourth, according to the manufacturing method of graphene by interface growth between gallium and amorphous carbon of (4), a graphene substrate finally obtained will comprise a layered structure consisting of a graphene layer, an amorphous carbon layer, and a support substrate. In this case, the extra amorphous carbon layer serves as a principal electric conduction passage, which makes it difficult to manufacture a device from such a substrate.

This invention has been made in view of the problems mentioned in the above, and an object of the invention is to provide a manufacturing method of a graphene substrate which is a graphene-on-insulator substrate having good mass producibility and high quality, is directly usable for manufacture of semiconductor devices, and yet can be manufactured at low cost.

In order to solve the problem described above, a first aspect of the invention provides a manufacturing method of a graphene substrate including: (a) heating a metal layer and a carbide layer with the metal layer placed in contact with the carbide layer to dissolve carbon in the carbide layer into the metal layer; and (b) cooling the metal layer and the carbide layer to segregate the carbon in the metal layer as graphene on the surface of the carbide layer.

A second aspect of the invention provides a graphene substrate manufactured by using the manufacturing method of a graphene substrate according to the first aspect.

A third aspect of the invention provides a semiconductor device manufactured with use of the graphene substrate according to the second aspect.

Advantageous Effects of the Invention

The invention is capable of providing a manufacturing method of a graphene-on-insulator substrate which has mass productivity, high quality, and yet is usable directly for manufacture of a semiconductor device at a low manufacturing cost.

Figure 1:
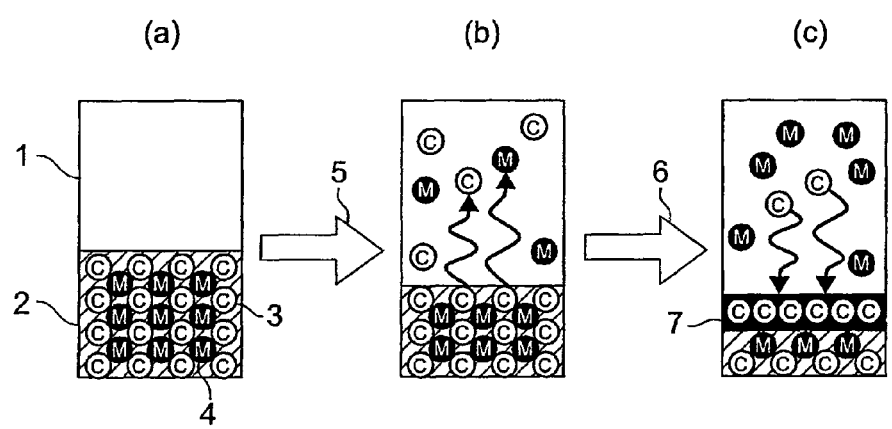
FIG. 1 is a diagram schematically showing a manufacturing method of a graphene substrate according to a first embodiment.

LIST OF REFERENCE NUMERALS 1 metal layer
2 carbide layer
3 carbon
4 metal
7 graphene
7a graphene
7e strip graphene
7f two-dimensional graphene
8 graphene substrate
8a graphene substrate
8b graphene substrate
8c graphene substrate
8d graphene substrate
8e graphene substrate
8f graphene substrate
12 substrate
12a substrate
20 second substrate
21 holder
21a holder
22 spacer
31 mask
32 source and drain electrode contacts
33 graphene channel
34 source and drain electrodes
35 gate insulator
36 gate electrode
37 electric field effect transistor
41 lower recess
43 upper recess

MODE FOR CARRYING OUT THE INVENTION

Preferred embodiments of the invention will be described in detail with reference to the drawings.

Firstly, a manufacturing method of a graphene substrate according to a first embodiment will be schematically described with reference to FIG. 1.

As shown in FIG. 1(a), a metal layer 1 is placed on a carbide layer 2 containing carbon 3 and metal 4 to be in contact with the carbide layer 2, and this bilayer structure consisting of the metal layer and the carbide layer is heated.

Then, the metal layer 1 is liquefied as shown in FIG. 1(b), and the carbon 3 and metal 4 present in the surface of the carbide layer 2 are dissolved into the metal layer 1.

This means that the metal layer 1 in its liquid state serves as a flux to dissolve the carbon 3.

The metal layer 1 used may be one that exhibits very low carbon solubility, specifically a ppm-level carbon solubility even at a high temperature.

Therefore, only a negligible quantity of carbon 3 is dissolved into the metal layer 1, while the extremely low carbon solubility limits the rate whereby the quantity of the metal 4 dissolved into the metal layer 1 also becomes a negligible quantity.

Finally, as show in FIG. 1(c), the metal layer 1 having an infinitesimal quantity of carbon 3 is dissolved thereinto is cooled, whereby the carbon solubility of the metal layer 1 is reduced. Thus the carbon 3 becomes oversaturated and is segregated on the surface of the carbide layer 2 as graphene 7.

It is believed that the carbon is segregated as graphene 7 comprising a two-dimensional structure but not segregated as amorphous carbon because the metal layer 1 serves as a catalyst for forming the graphene.

It is also believed that the growth of graphene layer is promoted by the fact that the surface of the substrate 2 is smooth and the surface structure of the substrate 2 is lattice-matched with the surface structure of the graphene.

Normally, no metal 4 is segregated in the cooling process of FIG. 1(c). This is because the metal 4, having a solubility of from several hundreds of ppm to percent level even at room temperature, will not be oversaturated. However, if conditions for recrystallization of the metal 4, including prolonged cooling time, are all met, the metal 4 may be deposited on rare occasions. In such a case, the metal is only adhered as particles on the surface of the graphene layer, and hence these metal particles can be easily removed from the graphene with acid, alkali, or the like.

Therefore, it is made possible to selectively form only the graphene on the surface of the carbide layer 2 directly without any inclusion.

The foregoing is schematic description of the manufacturing method of a graphene substrate by a flux method according to the invention.

Figure 2:
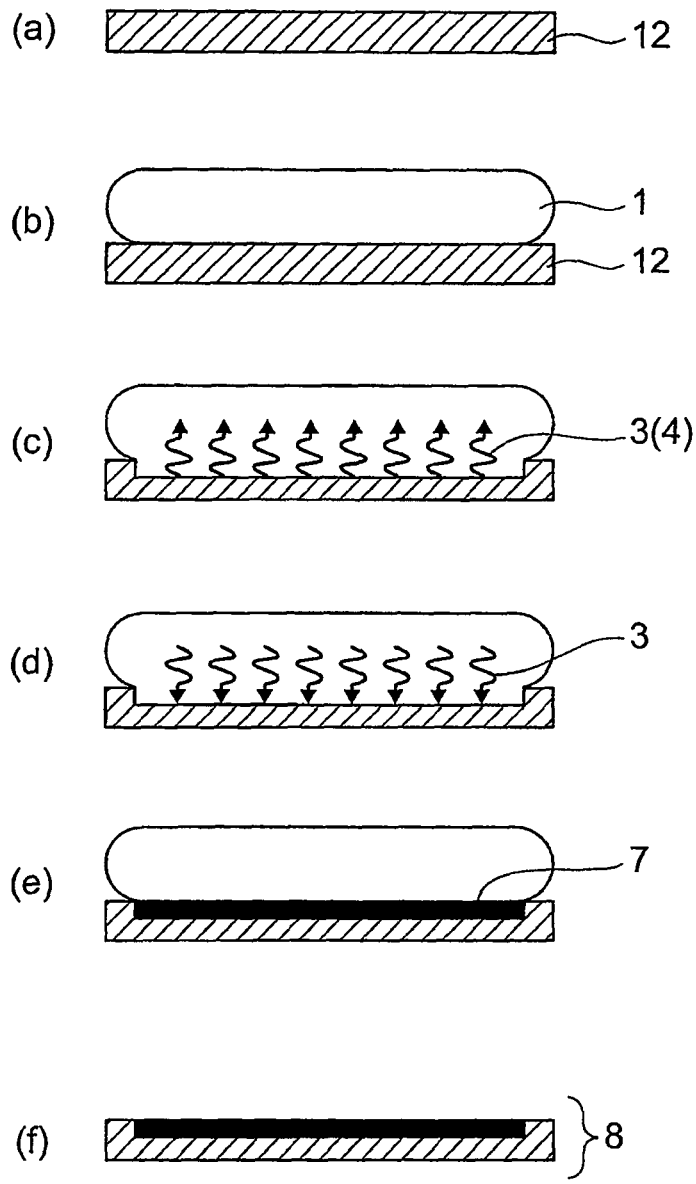
FIG. 2 is a diagram showing details of the manufacturing method of a graphene substrate according to the first embodiment.

Referring to FIG. 2, the manufacturing method of a graphene substrate 8 will be described more specifically.

Firstly, as shown in FIG. 2(a), a substrate 12 comprising a carbide layer 2 on the surface thereof is prepared.

The substrate 12 to be prepared will suffice only if it comprises carbide layer 2 on the surface thereof. Thus, it may be one with a carbide layer 2 formed on a suitable substrate, or the entire substrate 12 may be formed of a carbide.

The surface of the substrate 12 should be preliminarily cleaned by an appropriate method.

As described before, the graphene 7 is made from the carbon 3 contained in the carbide layer 2. The carbide layer 2 is made of at least one material selected from the group consisting of silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), and tungsten carbide (WC).

As shown in FIG. 2(b), a metal layer 1 is placed on the substrate 12, and the metal layer 1 and the carbide layer 2 are arranged in close contact with each other such that no air bubble is contained therebetween.

As mentioned before, the metal layer 1 functions as a flux to dissolve the carbon 3.

Further, as mentioned before, the metal layer 1 with a carbon solubility of ppm level is used here.

The use of a metal having such a low carbon solubility constitutes an essential condition for forming graphene that is an ultrathin atomic layer thin film, instead of graphite.

Such a metal may be at least one selected from the group consisting of gallium (Ga), indium (In), tin (Sn), zinc (Zn), cadmium (Cd), mercury (Hg), thallium (Tl), lead (Pb), and bismuth (Bi).

When the metal layer 1 is closely attached to the carbide layer 2 at room temperature, the metal layer 1 should preferably be of a metal which assumes a liquid state around room temperature for the sake of ease in handling.

For example, metals which assume a liquid state around room temperature include, gallium (with a melting point of 29.8° C.), gallium-indium alloy (with a melting point of about 15.7° C.), gallium-indium-tin alloy (with a melting point of 19° C.), bismuth-lead-tin-cadmium-indium alloy (with a melting point of about 46.7° C.) and the like.

However, it is not always necessary to use a metal having a melting point around room temperature if the attachment is performed while heating the metal appropriately.

Subsequently, the substrate 12 and the metal layer 1 (the bilayer structure of the metal layer and the carbide layer) are heated under a vacuum or inert gas flow, with use of an appropriate heating device such as an electric furnace or the like.

Then, as shown in FIG. 2(c), the carbon 3 and the metal 4 forming the carbide layer 2 are dissolved from the surface of the substrate 12 into the metal layer 1.

The heating temperature is preferably from 800° C. to 1200° C., and more preferably from 900° C. to 1100° C.

The lower temperature limit of 800° C. is the lowest required temperature for formation of graphene, while the higher limit of 1200° C. is determined based on the necessity to control the amount of dissolved carbon 3 such that the number of layers of graphene is limited to ten or so.

When the heating temperature is set to a range of 900 to 1100° C., especially high quality graphene can be obtained.

The term "high-quality graphene" as used herein means graphene having high crystallinity.

Specifically, it means graphene having a low D/G ratio that is a ratio between the intensity of D-band and that of G-band obtained by Raman spectroscopy. The D/G ratio should be as low as possible, and preferably the D/G ratio is 0.2 or lower.

The D-band is an abbreviation of Defect band, which is a Raman band resulting from a defect structure appearing in the vicinity of 1350 $cm^{-1}$. The G-band is an abbreviation of Graphite band, which is a Raman band resulting from totally symmetric stretching vibration of C—C bond in an ideal crystal appearing in the vicinity of up to 1580 $cm^{-1}$.

In consideration of the limits of the graphene quality, the highest quality is obtained when the graphene is a perfect crystal with a D/G ratio of zero, whereas the lowest quality is obtained when the graphene is amorphous with a D/G ratio of one or more.

Next, as shown in FIG. 2(d), the bilayer structure of the metal layer and the carbide layer (substrate 12) is cooled, whereby the carbon 3 dissolved in the metal layer 1 starts to be segregated. Finally, the graphene 7 is formed on the substrate 12 as shown in FIG. 2(e).

During this process, the metal 4 dissolved in the metal layer 1 is not oversaturated as mentioned before, and hence normally no metal 4 is deposited. Thus, only the graphene 7 is formed directly on the surface of the substrate 12 without any inclusion.

When the heating temperature exceeds 800° C., it is desirable to take 30 to 150 minutes to lower the temperature from the heated temperature to 800° C., and most desirable to take 60 to 120 minutes.

The lower limit of 30 minutes for the cooling time denotes a minimum required time for forming graphene, and the upper limit of 150 minutes for the cooling time is determined due to the necessity to ensure high quality since the quality of graphene 7 is degraded if it takes more time than 150 minutes.

The optimum cooling time is set to a range from 60 to 120 minutes also because especially high quality graphene can be obtained when it takes this range of time to lower the temperature.

On the other hand, when the heating temperature is 800° C., this temperature should desirably be maintained for 30 to 150 minutes, and most desirably for 60 to 120 minutes.

The cooling conditions after the temperature is lowered to 800° C. may be arbitrary, and it can be cooled naturally, for example.

Finally, a most part of the metal layer 1 is physically removed by a suitable method such as suction, and then any residual metal layer 1 is totally removed by dissolving the same with acid or the like, whereby a graphene substrate 8 is obtained as shown in FIG. 2(f).

The acid to dissolve the residual metal layer 1 may be hydrochloric acid (HCl), sulfuric acid ($H_2SO_4$), nitric acid ($HNO_3$) or the like. The dissolution of the metal layer 1 can be promoted by heating the acid to an appropriate temperature (up to 80° C.). As mentioned before, if the cooling time is too long (about 90 minutes or more), the metal 4 might be deposited on the graphene as particles (with a diameter of a few micrometers). In this case, the metal particles are removed with acid or alkali.

According to the first embodiment as described above, the graphene substrate 8 is manufactured by heating the metal layer 1 and the carbide layer 2 while the metal layer 1 and the carbide layer 2 are in contact with each other, to dissolve the carbon 3 in the carbide layer 2 into the metal layer 1, and then cooling the metal layer 1 and the carbide layer 2 to segregate the carbon 3 in the metal layer 1 as the graphene 7 on the surface of the carbide layer 2.

This makes it easy to increase the size of the graphene substrate 8, and makes it possible to manufacture a graphene substrate of a large area.

Further, according to the first embodiment, unlike SiC thermal decomposition graphene, there is no need of high-temperature treatment (up to 1600° C.) or hydrogen plasma or silane treatment for the substrate 12, and thus the manufacturing cost can be reduced.

Further, according to the first embodiment, the substrate 12 comprises a carbide layer 2 on the surface thereof, and hence the substrate 12 is an insulator in general. This means that the graphene substrate 8 is a graphene-on-insulator substrate.

Therefore, the graphene substrate 8 according to the first embodiment is completely different from a gallium and amorphous carbon interface growth graphene, and can be used directly for manufacture of graphene devices.

Furthermore, the manufacturing method according to the first embodiment does not require a transfer process that is required for CVD graphene and may degrade the quality of the graphene 7. Therefore, the manufacturing method according to the first embodiment provides an advantage that graphene devices can be manufactured while keeping the high quality.

Specifically, the graphene manufacturing method according to the first embodiment has mass productivity and is yet capable of manufacturing high quality graphene at a low cost and the obtained graphene can be used directly for manufacture of semiconductor devices.

Next, a second embodiment of the invention will be described.

The manufacturing procedures according to the second embodiment are basically the same as those of the first embodiment except two differences described below.

One of these differences resides in that measures are taken to prevent evaporation or flowage of the metal layer 1, specifically the metal layer 1 is sandwiched between the carbide layer 2 (substrate 12) and a second substrate 20.

The second difference resides in that graphene 7 is formed directly on the second substrate 20.

Figure 3:
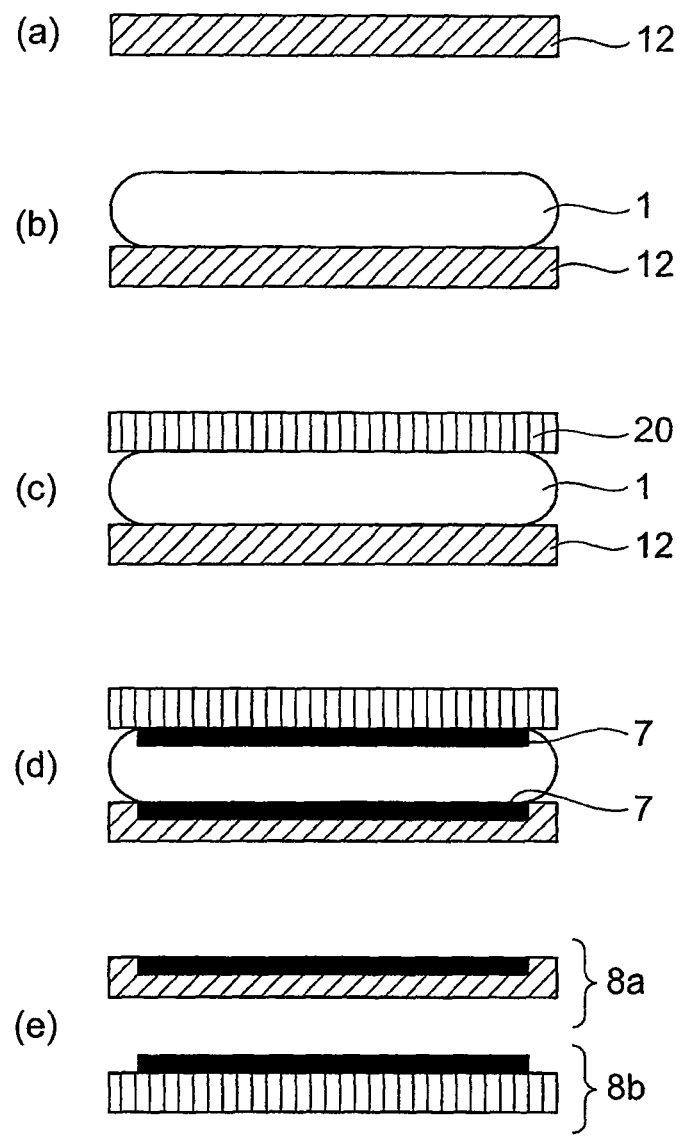
FIG. 3 is a diagram showing details of a manufacturing method of a graphene substrate according to a second embodiment.

Referring to FIG. 3, a manufacturing method of graphene substrates 8a and 8b according to the second embodiment will be described.

In the description of the second embodiment, elements having the same functions as those of the first embodiment will be indicated by the same reference numerals and description thereof will be omitted.

As shown in FIG. 3(*a*), a substrate 12 is prepared.

Next, as shown in FIG. 3(*b*), a metal layer 1 is placed on the substrate 12 so that the metal layer 1 is in contact with a carbide layer 2.

As shown in FIG. 3(*c*), a second substrate 20 (heat resistant material layer) is arranged on the metal layer 1 so that they are in contact with each other.

The material of the second substrate 20 can be selected from materials having heat resistance such as a carbide (forming the carbide layer 2), quartz ($SiO_2$), alumina or sapphire ($Al_2O_3$), boron nitride (BN), zirconia ($ZrO_2$), and aluminum nitride (AlN).

Thus, the second substrate 20 is arranged on the metal layer 1 in close contact therewith, whereby evaporation of the metal layer 1 during heating can be reduced in comparison with the first embodiment.

Next, as shown in FIG. 3(*d*), graphene 7 is formed by heating and cooling.

In this process, as shown in FIG. 3(*d*), the graphene 7 is grown not only on the substrate 12 but also on the second substrate 20.

Therefore, not only the graphene substrate 8a on the carbide layer 2 (substrate 12) but also the graphene substrate 8b on the second substrate 20 can be used for manufacture of graphene devices.

Accordingly, the arrangement shown in FIG. 3 makes it possible to produce graphene on substrates of various materials.

Finally, as shown in FIG. 3(*e*), the metal layer 1 is removed from the substrate 12 and the second substrate 20, whereby the graphene substrates 8a and 8b are completed.

According to the second embodiment as described above, the graphene substrate 8a is manufactured by a method in which the metal layer 1 and the carbide layer 2 are heated with the metal layer 1 placed on the carbide layer 2 so that the carbon 3 in the carbide layer 2 is dissolved into the metal layer 1, and then the metal layer 1 and the carbide layer 2 are cooled so that the carbon 3 in the metal layer 1 is segregated as the graphene 7 on the surface of the carbide layer 2.

Therefore, the second embodiments provides the same effects as those of the first embodiment.

Further, according to the second embodiment, the metal layer 1 is heated and cooled to segregate the graphene 7 after the second substrate 20 is placed on the metal layer 1 in close contact therewith.

Therefore, the evaporation of the metal layer 1 during heating can be reduced in comparison with the first embodiment.

Further, the graphene substrate 8b on the second substrate 20 also can be used for manufacture of graphene devices.

Next, a third embodiment of the invention will be described with reference to FIG. 4.

In the third embodiment, unlike the first embodiment in which the metal layer 1 is arranged on the substrate 12, the metal layer 1 is arranged in a holder 21 and the substrate 12 is arranged thereon to form a graphene substrate 8.

In the description of the third embodiment, elements having the same functions as those of the first embodiment will be indicated by the same reference numerals and description thereof will be omitted.

Figure 4:
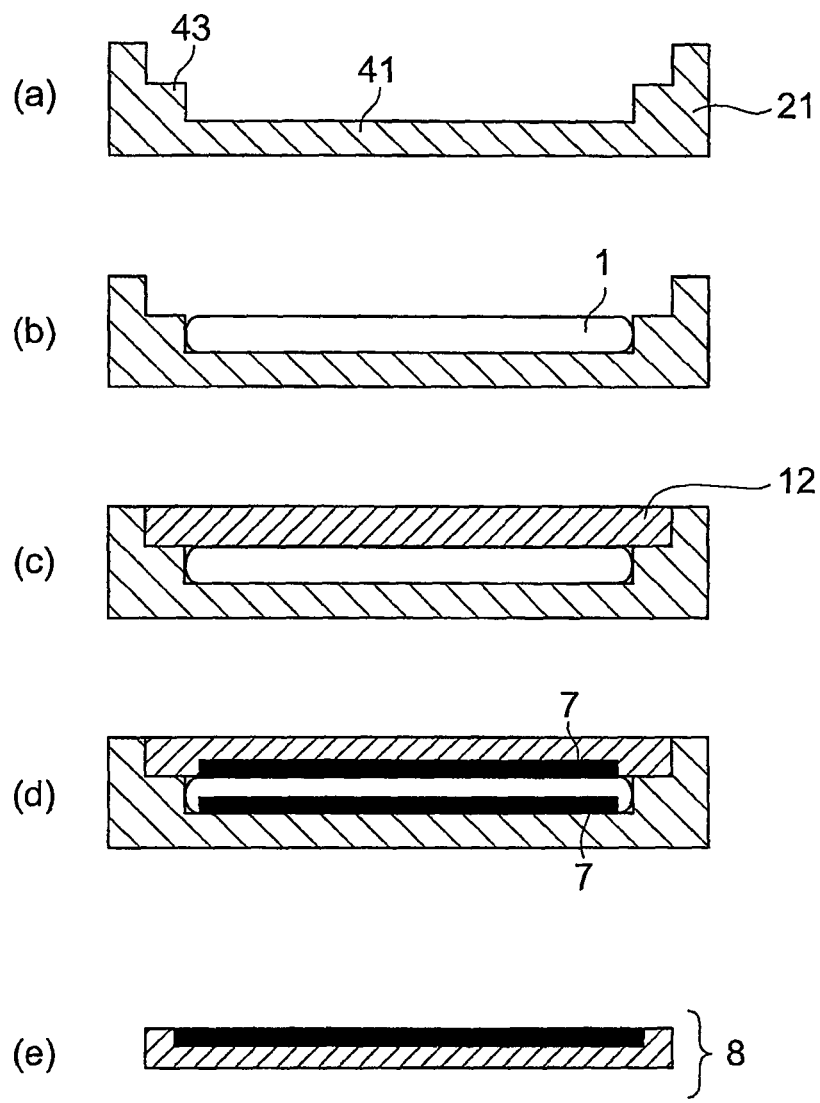
FIG. 4 is a diagram showing details of a manufacturing method of a graphene substrate according to a third embodiment.

Referring to FIG. 4, a manufacturing method of a graphene substrate 8 according to the third embodiment will be described.

Firstly, as shown in FIG. 4(*a*), a holder 21 is prepared.

As shown in FIG. 4(*a*), the holder 21 comprises a box-like shape which is recessed in two processes. The lower recess 41 (the recess on the bottom side) corresponds to the shape and dimensions of the metal layer 1, while the upper recess 43 (the recess on the top side) corresponds to the shape and dimensions of the substrate 12.

The material of the holder 21 may be any as long as it can resist a heat treatment as described later.

Such a material may be quartz ($SiO_2$), alumina or sapphire ($Al_2O_3$), boron nitride (BN), zirconia ($ZrO_2$), aluminum nitride (AlN) or the like.

Then, as shown in FIG. 4(*b*), the metal layer 1 is placed in the lower recess 41 of the holder 21.

Next, as shown in FIG. 4(*c*), the substrate 12 is placed in the upper recess 43 of the holder 21 so that the carbide layer 2 is in contact with the metal layer 1.

As shown in FIG. 4(*d*), graphene 7 is formed by heating and cooling.

In the state shown in FIG. 4(*d*), the metal layer 1 is held in the holder 21 with its bottom face and side faces in contact with the holder 21, and its top face in contact with the substrate 12.

Therefore, the metal layer 1 which has been molten during heating is prevented from flowing by the holder 21, while is prevented from evaporating upward by the metal layer 1.

This minimizes the loss due to evaporation and flowage of the metal layer 1.

Finally, as shown in FIG. 4(*e*), the substrate 12 is taken out of the holder 21, and the metal layer 1 is removed from the substrate 12, whereby the graphene substrate 8 is completed.

According to the third embodiment as described above, the graphene substrate 8 is manufactured by placing the metal layer 1 on the carbide layer 2, heating the metal layer 1 and the carbide layer 2 to dissolve the carbon 3 in the carbide layer 2 into the metal layer 1, and then cooling the metal layer 1 and the carbide layer 2 so that the carbon 3 in the metal layer 1 is segregated as graphene 7 on the surface of the carbide layer 2.

Accordingly, the third embodiment provides the same effects as those of the first embodiment.

Further, according to the third embodiment, the graphene substrate 8 is manufactured by placing the metal layer 1 in the holder 21 and then placing the substrate 12 thereon.

Therefore, the manufacturing method of the third embodiment is able to minimize the loss due to evaporation or flowage of the metal layer 1.

A fourth embodiment of the invention will be described with reference to FIG. 5.

The fourth embodiment is similar to the second embodiment but is different therefrom in that graphene substrates 8*a*, 8*b* are manufactured in a holder 21*a*.

In the description of the fourth embodiment, elements having the same functions as those of the second embodiment will be indicated by the same reference numerals and description thereof will be omitted.

Figure 5:
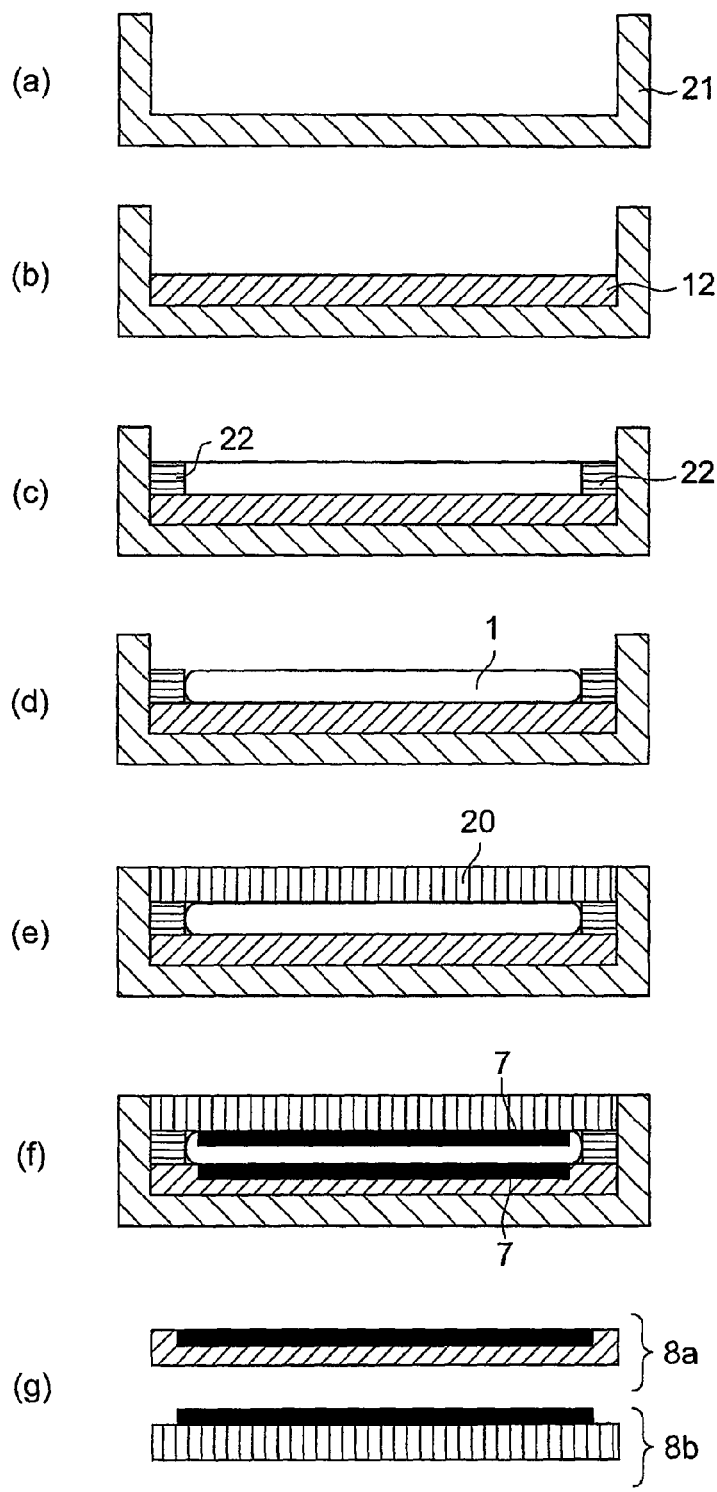
FIG. 5 is a diagram showing details of a manufacturing method of a graphene substrate according to a fourth embodiment.

Referring to FIG. 5, a manufacturing method of graphene substrates 8*a*, 8*b* according to the fourth embodiment will be described.

Firstly, as shown in FIG. 5(*a*), a holder 21*a* is prepared.

The holder 21*a* is of a box-like shape with a recess, and is made of the same material as that of the holder 21 of the third embodiment.

However, the holder 21*a* is different from the holder 21 in that it has a single step recess which is of a shape corresponding to that of the substrate 12.

Then, as shown in FIG. 5(*b*), the substrate 12 is arranged in the holder 21*a* such that the carbide layer 2 faces up (faces the open end of the holder 12*a*).

Next, as shown in FIG. 5(*c*), a spacer 22 is placed on the substrate 12.

The spacer 22 comprises a frame-like shape, and the outer peripheral shape of the frame corresponds to the inner peripheral shape of the holder 21*a*. The inner peripheral shape of the frame corresponds to the outer peripheral shape of the metal layer 1.

The material of the spacer 22 may be any as long as it can resist a heat treatment as described later, like the holders 21 and 21*a*.

Specifically, the material of the spacer 22 may be quartz ($SiO_2$), alumina or sapphire ($Al_2O_3$), boron nitride (BN), zirconia ($ZrO_2$), aluminum nitride (AlN) or the like.

Next, as shown in FIG. 5(*d*), the metal layer 1 is placed within the frame of the spacer 22 to be in contact with the carbide layer 2 of the substrate 12.

As shown in FIG. 5(*e*), a second substrate 20 is placed on the spacer 22 and the metal layer 1 so that the second substrate 20 is in contact with the metal layer 1.

Next, as shown in FIG. 5(*f*), heating and cooling are performed to form graphene 7.

The bottom face of the metal layer 1 is in contact with the substrate 12, the side faces are in contact with the spacer 22, and the top face is in contact with the second substrate 20.

Thus, during heating, the metal layer 1 is prevented from flowing by the substrate 12 and the spacer 22, while is prevented from evaporating upward by the second substrate 20.

Finally, as shown in FIG. 5(*g*), the substrate 12 and the second substrate 20 are taken out of the holder 21*a*, the metal layer 1 is removed, and thus the graphene substrates 8*a*, 8*b* are completed.

The substrate 12 and the second substrate 20 may be arranged in reversed positions.

According to the fourth embodiment as described above, the graphene substrates 8 and 8*a* are manufactured by a method in which the metal layer 1 and the carbide layer 2 are heated with the carbide layer 2 placed in contact with the metal layer 1 to thereby dissolve the carbon 3 in the carbide layer 2 into the metal layer 1, and then the metal layer 1 and the carbide layer 2 are cooled to segregate the carbon 3 in the metal layer 1 as the graphene 7 on the surface of the carbide layer 2 and the second substrate 20.

Therefore, the fourth embodiment provides the same effects as those of the second embodiment.

Further, according to the fourth embodiment, the graphene 7 is formed by heating and cooling with use of the holder 21*a* and the spacer 22 in a state in which the bottom face of the metal layer 1 is in contact with the substrate 12, the side faces with the spacer 22, and the top face with the second substrate 20.

Therefore, according to the fourth embodiment, flowage and evaporation of the metal layer 1 during heating can be prevented or reduced in comparison with the second embodiment.

Next, a fifth embodiment of the invention will be described.

The fifth embodiment is the same as the first to fourth embodiments except that graphene 7 is formed on the surfaces of substrates 12 with various surface shapes.

Figure 6:
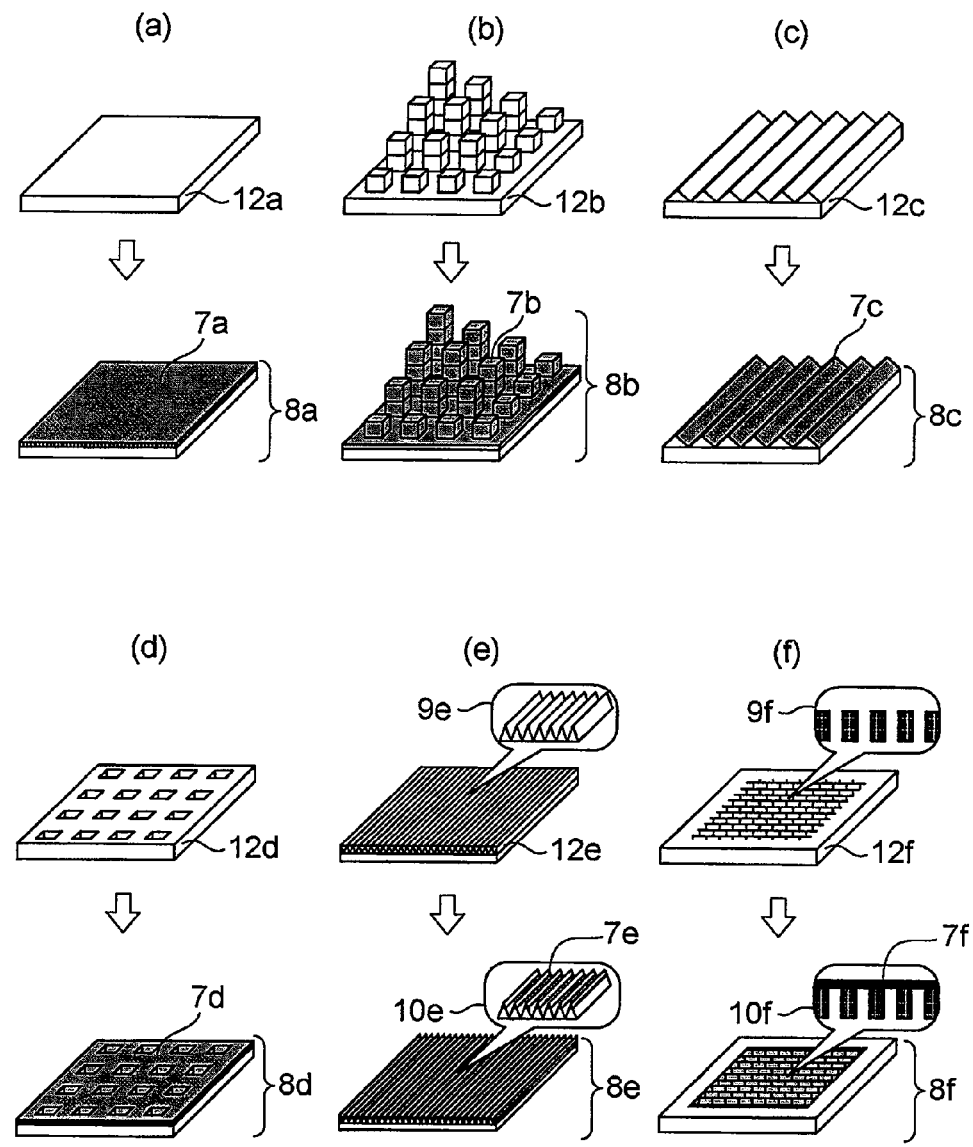
FIG. 6 is a diagram showing details of a manufacturing method of a graphene substrate according to a fifth embodiment.

A substrate 12*a* shown in FIG. 6(*a*) comprises the same planar shape as that of the substrate 12 used in the first to fourth embodiments, that is, the substrate 12*a* comprises a flat planar shape.

Accordingly, a flat graphene substrate 8*a* comprising flat graphene 7*a* can be obtained from the flat substrate 12*a* by the methods as described in the first to fourth embodiments.

A graphene substrate 8*b* comprising a three-dimensional structure of projections is obtained in FIG. 6(*b*), a graphene substrate 8*c* comprising a three-dimensional structure of corrugated surface is obtained in FIG. 6(*c*), and graphene substrate 8*d* comprising a three-dimensional structure of recesses is obtained in FIG. 6(*d*).

When the three-dimensional structures in FIGS. 6(*b*) to 6(*d*) are sufficiently large in size (100 μm or more), a liquefied metal layer 1 can be in contact with all the faces of the carbide layer 2, and thus all the faces of the three-dimensional structures are graphenized. In contrast, when the periodic dimensions of the three-dimensional structures are generally as small as 100 μm or less, as shown in FIGS. 6(*e*) and 6(*f*), the liquefied metal layer 1 is not able to be in contact with all the faces of the three-dimensional structures of the carbide layer 2.

This is due to interfacial tension of the metal forming the metal layer 1.

Therefore, in the case of FIG. 6(*e*), for example, as shown in FIG. 9*e* that is an enlarged view thereof, only the apexes (crests) of projections of the undulations (concave-convex shape) of the carbide layer 2 are graphenized, and thus as shown in FIG. 10e that is an enlarged view of a graphene substrate 8e, the graphene substrate 8e thus obtained has strips of graphene 7e.

In the case of FIG. 6(f), as shown in FIG. 9f that is an enlarged view thereof, liquefied flux is not able to penetrate into a mesh structure and is in contact with only the surface of the mesh structure.

In this case, the period of the mesh structure is small enough to allow graphenization to progress, forming bridges between the mesh (projections).

As a result, as shown in FIG. 10f that is an enlarged view, a graphene substrate 8f comprising the mesh structure covered with two-dimensional graphene 7f is obtained. These graphene substrates 8a to 8f can be used to fabricate various graphene devices as described later.

A sixth embodiment of the invention will be described.

In the sixth embodiment, an electric field effect transistor 37 is manufactured using a graphene substrate 8 according to the first embodiment.

In the description of the sixth embodiment, elements having the same functions as those of the first embodiment are indicated by the same reference numerals and description thereof will be omitted.

Figure 7:
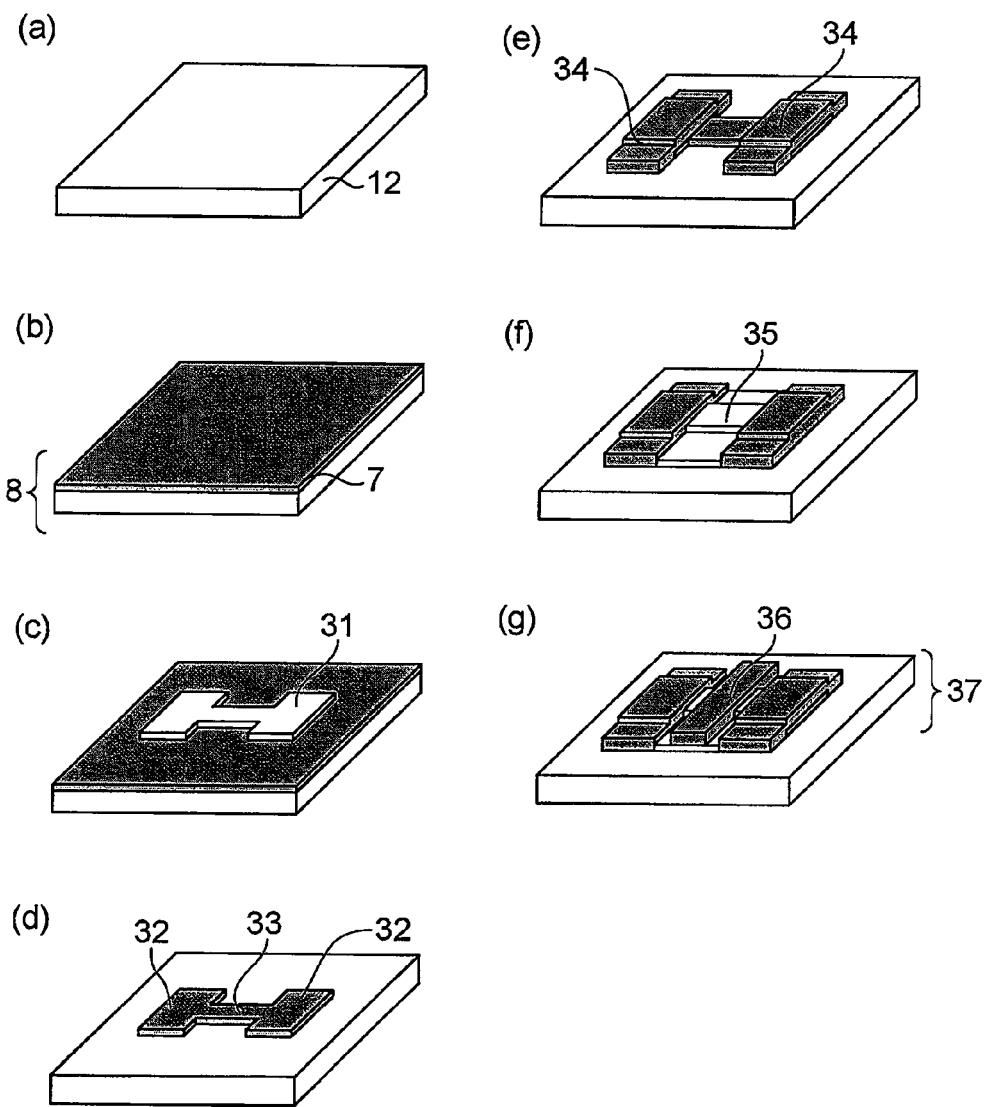
FIG. 7 is a diagram showing procedures for manufacturing an electric field effect transistor 37 according to a sixth embodiment.

Referring to FIG. 7, a manufacturing method of an electric field effect transistor 37 according to the sixth embodiment will be described.

This example described below relates to procedures for manufacturing an electric field effect transistor 37 comprising graphene 7 as a channel with use of a typical lithography technique.

Firstly, as shown in FIG. 7(a), a substrate 12 comprising a carbide layer 2 on its surface layer or a carbide substrate is prepared, and as shown in FIG. 7(b), a graphene substrate 8 comprising the substrate 12 covered with graphene 7 is obtained by the method according to the first embodiment.

Subsequently, a mask 31 is formed as shown FIG. 7(c), by resist coating, lithography exposure, and wet etching. Then, the graphene 7 not covered with the mask 31 is dry-etched with oxygen plasma to obtain source and drain electrode contacts 32 and a graphene channel 33 formed of the graphene 7 as shown in FIG. 7(d).

Subsequently, as shown in FIG. 7(e), source and drain electrodes 34 are formed by vapor deposition, and further a gate insulator 35 is formed by vapor deposition as shown in FIG. 7(f).

Finally, as shown in FIG. 7(g), a gate electrode 36 is formed on the gate insulator 35 by vapor deposition, so that an electric field effect transistor 37 comprising the graphene 7 as a channel is finally obtained.

While FIG. 7 illustrates an example in which the electric field effect transistor 37 is manufactured starting from the flat graphene substrate 8a shown in FIG. 6(a), various other graphene devices can be obtained by starting from the graphene substrates 8b to 8f comprising various surface structures as shown in FIGS. 6(b) to 6(f).

For example, from the graphene substrates 8b to 8d with three-dimensional structures shown in FIGS. 6(b) to 6(d), semiconductor devices usable in a mechano-electronics field such as mechanical elements and parts, sensors, and MEMS (Micro Electro Mechanical Systems) or NEMS (Nano Electro Mechanical Systems) formed by a combination of an actuator and an electronic circuit can be obtained.

Further, from the graphene substrates 8c to 8f comprising periodic structures shown in FIGS. 6(c) to 6(f), semiconductor devices usable in an opto-electronics field such as amplifiers, transmitters, light sources, lasers, and very high speed and broadband information communication equipment can be obtained if the period of the periodic structures are of a wavelength from far-infrared to terahertz electromagnetic wave band.

Furthermore, starting from the graphene substrates 6e and 6f comprising fine periodic structures shown in FIGS. 6(e) and 6(f), semiconductor devices usable in environment and energy fields such as solar batteries, energy efficient light emitting diode illuminations, and thermoelectric transducers.

EXAMPLES

The invention will be described in more detail based on examples.

Example 1

Graphene substrates 8a and 8b were fabricated at various heating temperatures by the method shown in FIG. 5, and relationship between heating temperature and structure of the graphene 7 in the graphene substrates 8a and 8b was investigated. Specific procedures are as described below.

Firstly, a silicon carbide substrate (6H—SiC/silicon surface, 10×10×0.45 mmt) was prepared as a substrate 12 (carbide layer 2) and a sapphire substrate (10×10×1 mmt) was prepared as a second substrate 20, and the substrates were washed with isopropyl alcohol and then with acetone.

The sapphire substrate was heated at 1000° C. in the atmosphere for one hour, whereby any carbon compounds were completely removed.

Subsequently, as shown in FIG. 5, the sapphire substrate was fit in the holder 21a, then 200 µl (microliters, corresponding to about 1 g) of molten gallium was placed on the sapphire substrate, and then a silicon carbide substrate was placed on the gallium.

Six such samples were prepared. Then, the holder 21a holding the sapphire substrate, the gallium and the silicon carbide substrate was set within an electric furnace which was evacuated with a vacuum pump, and then the holder 21a was preheated for 30 minutes at 300° C. in order to remove organic materials or the like possibly adhered on the holder and the like.

The holder and the substrates were heated for growth of graphene and then cooled to room temperature.

Figure 8:
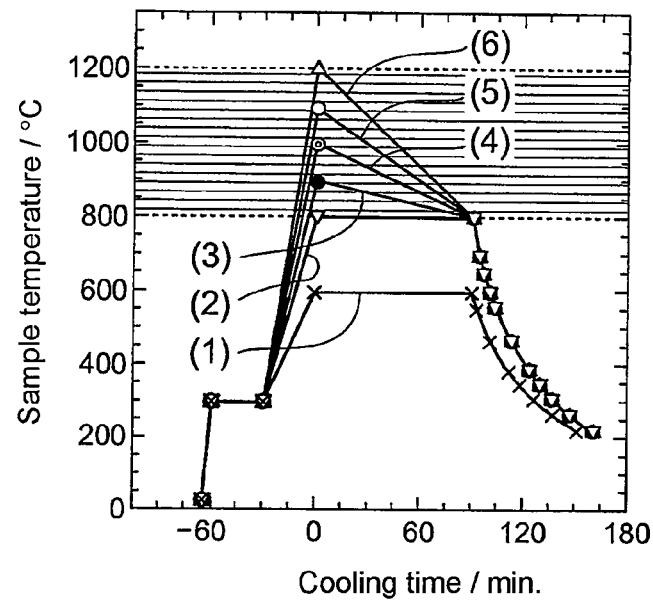
FIG. 8 is a graph showing temperature conditions during manufacture of a graphene substrate of Example 1.

As shown in FIG. 8, the heating temperatures were (1) 600° C., (2) 800° C., (3) 900° C., (4) 1000° C., (5) 1100° C., and (6) 1200° C., respectively, for the six samples.

As shown in FIG. 8, the cooling temperature was kept at the same level as the heating temperature for 90 minutes for the samples (1) and (2), whereas the period of time in which the temperature was lowered to 800° C. was fixed to 90 minutes for the samples (3) to (6).

After that, the substrate 12 and the second substrate 20 were taken out of the holder 21a, and the gallium was sucked with a pipet. The substrate 12 was then immersed in concentrated hydrochloric acid heated to 80° C. for 30 minutes to remove residual gallium. If any silicon particles derived from the SiC substrate were segregated on the graphene, the substrate 12 was immersed for 60 minutes in an aqueous solution of 50% potassium hydroxide or aqueous solution of 25% tetramethyl ammonium hydroxide heated to 80° C. to remove the silicon particles.

Finally, the substrate 12 was washed with isopropyl alcohol and acetone, and dried with nitrogen blow.

Specimens were completed through the processes described above.

Next, the state of graphene formation on the surface of each of the silicon carbide substrate (graphene substrate 8a) and the sapphire substrate (graphene substrate 8b) was evaluated by Raman spectroscopy.

As a result, it was found, for both the graphene substrates 8a and 8b derived respectively from the silicon carbide substrate and the sapphire substrate, that: in the case of (1) in which the heating temperature was 600° C., since the D/G ratio was as large as about 1, little graphenization occurred and the substrate was evaluated to be rather amorphous; in the cases of (2) (the heating temperature was 800° C.) to (6) (the heating temperature was 1200° C.), since the D/G ratio was as small as 0.2 or less, graphenization progressed sufficiently and thus the graphene 7 was evaluated to be of high quality.

It was also found that the number of layers forming the graphene 7 was in a range from one to ten, and the number increased as the heating temperature was made higher.

In the cases of (3) to (5), the quality of graphene 7 was particularly high.

It can be concluded from the above that the heating temperature suitable for manufacturing the graphene substrates 8a and 8b according to the invention is 800 to 1200° C., and an optimum heating temperature is 900 to 1100° C.

Example 2

The same procedures as Example 1 were used to manufacture graphene substrates 8a and 8b, except that the cooling time was varied while the heating temperature was fixed, and relationship between cooling speed and structure of the graphene 7 in the graphene substrates 8a and 8b thus obtained was investigate.

Figure 9:
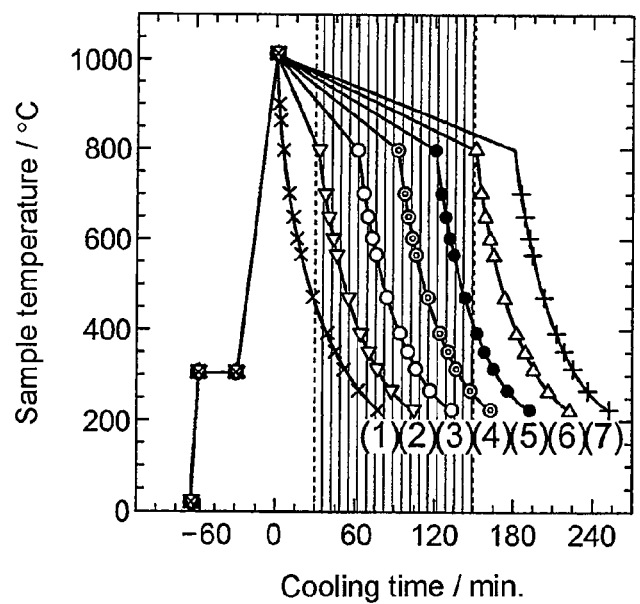
FIG. 9 is a graph showing temperature conditions during manufacture of a graphene substrate of Example 2.

Specifically, six samples were prepared, and as shown in FIG. 9, graphene substrates 8a and 8b were manufactured with the heating temperature fixed to 1000° C. as an optimum temperature for growth of graphene, while the cooling time was set variously to (1) 0 minute, (2) 30 minutes, (3) 60 minutes, (4) 90 minutes, (5) 120 minutes, (6) 150 minutes, and (7) 180 minutes. The other conditions were the same as the conditions in Example 1.

The term "cooling time" as used herein means a period of time required to cool from 1000° C. to 800° C.

Then, the state of graphene formation on the surface of each of the silicon carbide substrate (graphene substrate 8a) and the sapphire substrate (graphene substrate 8b) thus formed was evaluated by Raman spectroscopy.

As a result, it was found, for both the graphene substrates 8a and 8b derived respectively from the silicon carbide substrate and the sapphire substrate, that: in the case of (1), since the D/G ratio was as large as about one, little graphenization occurred and the substrate was evaluated to be rather amorphous; and in the cases of (2) to (6), since the D/G ratio was as small as 0.2 or less, graphenization progressed sufficiently and thus the graphene 7 was evaluated to be of high quality. The number of layers was from one to ten. In the cases of (3) to (5), in particular, since the D/G ratio was 0.1 or less, the quality of the graphene 7 was evaluated to be very high. However, in the case of (7) in which the D/G ratio was as small as 0.2 or less, even though it seemed that graphenization had occurred, the number of layers of graphene was much more than 10, judging from the shape of 2D-band (overtone of D-band) and center wave number in the vicinity of 2700 cm$^{-1}$. Therefore, it was determined that the quality of graphene had degraded.

It can be concluded from the above that the cooling time suitable for manufacturing the graphene substrates 8a and 8b according to the invention is from 30 to 150 minutes, and an optimum cooling time is from 60 to 120 minutes.

Example 3

Graphene substrates were fabricated on various carbide substrates (substrates 12) having different compositions under various heating temperature conditions, and relationship between heating temperature conditions and types of carbide making up the carbide substrates was evaluated. Specifically, the evaluation was conducted according to procedures as described below.

A plurality of substrates 12 (with a carbide layer 2) were prepared, consisting of a substrate with a 6H—SiC/carbon surface, one with a 4H—SiC/silicon surface, and one with a 4H—SiC/carbon surface, a tungsten carbide substrate, and a titanium carbide substrate, and graphene substrates 8 were fabricated from these substrates 12 under the same various heat treatment conditions as those of Example 1.

Figure 10:
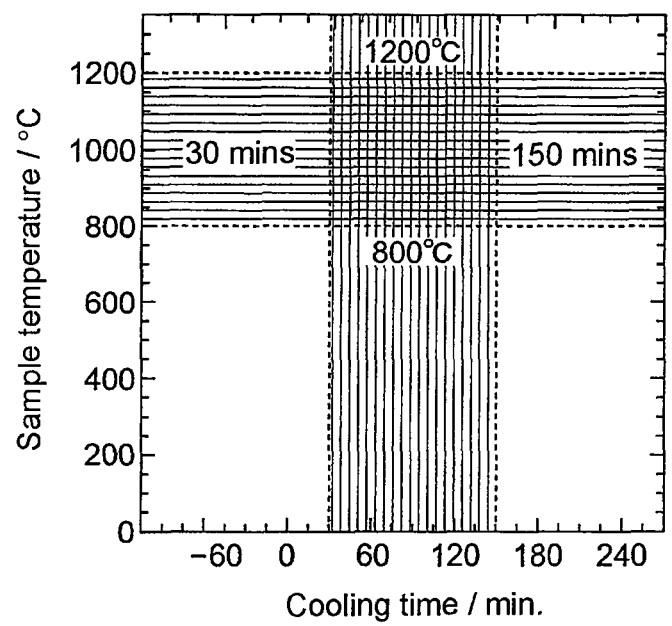
FIG. 10 is a diagram showing, on temperature profile, ranges of heating temperature and cooling time suitable for manufacture of a graphene substrate of Example 3.

The results are shown in FIG. 10.

FIG. 10 is a graph showing, on temperature profiles, ranges of heating temperature and cooling time suitable for manufacture of graphene substrates according to the invention.

As shown in FIG. 10, no matter what type of carbide was used, high-quality graphene 7 was obtained when the heating temperature was in a range of 800 to 1200° C., and the cooling time was in a range of 30 to 150 minutes.

Example 4

A graphene substrate 8a was fabricated under the same conditions as in Example 1, and surface state and structure of graphene 7 were evaluated.

Firstly, a graphene substrate 8a was fabricated.

Specifically, a graphene substrate 8a was fabricated under the same experiment conditions as in Example 1, at a heating temperature of 1000° C. and the cooling time to 800° C. being set to 60 minutes.

Figure 11:
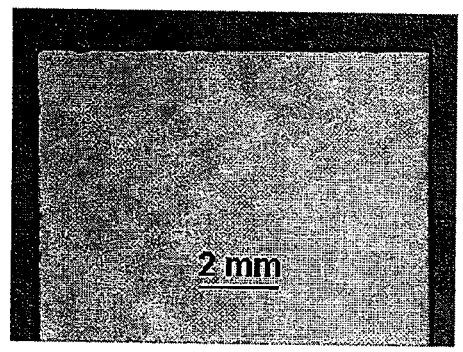
FIG. 11 is a diagram for explaining Example 4, (a) being a diagram showing a substrate before formation of graphene of Example 4, (b) being a diagram showing the substrate after formation of the graphene, and (c) being a diagram showing Raman spectrum of (b).
Figure 11:
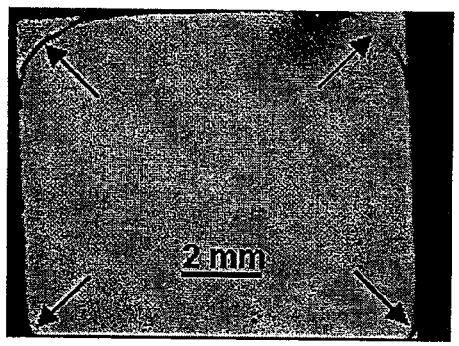
Figure 11:
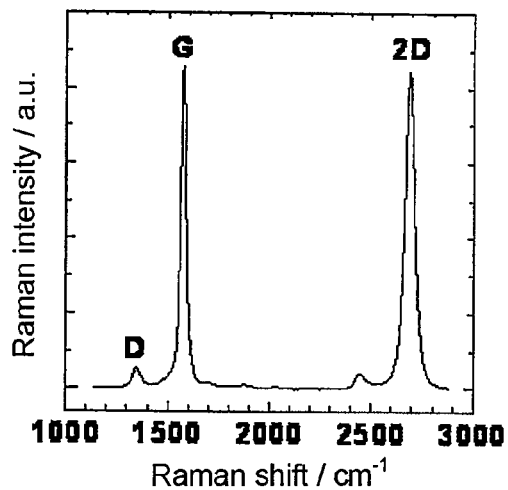

FIG. 11(a) shows a substrate 12 (silicon carbide substrate with a 6H—SiC/silicon surface of 10×10×0.45 mmt) before formation of graphene, and FIG. 11(b) shows a substrate (graphene substrate 8a) after formation of graphene.

The arrows at the four corners of FIG. 11(b) indicate boundaries of portions where the gallium is not in contact therewith.

As seen from comparison between FIGS. 11(a) and 11(b), a central pat was covered with graphene 7 in FIG. 11(b).

Next, a Raman spectrum of the surface of the graphene substrate of FIG. 11(b) was obtained.

A result is shown in FIG. 11(c).

As seen from FIG. 11(c), the D-band near 1350 cm$^{-1}$ indicating presence of a defect is small enough (D/G ratio is 0.05 or less), and the ratio between the G-band near 1580 cm$^{-1}$ and the 2D-band near 2700 cm$^{-1}$ is about 1:1. Therefore, it was found that the graphene 7 of two layers or so was dominant.

Example 5

Under the same experiment conditions as in Example 1, tests were conducted on second substrates 20 of different materials: silicon carbide (with 6H—SiC/silicon surfaces, semi-insulating), quartz, alumina, and hexagonal boron nitride. As a result, it was found that like in Example 1, graphene 7 was formed on any of these second substrates 20. Therefore, it was proved that according to the invention, the graphene 7 could be formed on the second substrates 20 as long as they were heat-resistant.

Example 6

An electric field effect transistor 37 was fabricated by using the graphene substrate 8 (graphene on silicon carbide) obtained by method of the invention, according to the procedures shown in FIG. 7.

The graphene substrate was fabricated under the same conditions as in Example 1 except that the heating temperature was set to 1000° C. and the cooling time to 800° C. was set to 90 minutes.

The obtained electric field effect transistor 37 evaluated for conduction property at room temperature with use of a prober and a semiconductor parameter analyzer.

As a result, the gate voltage dependence (transport property) of drain current exhibited ambipolar conduction that is specific to graphene, in which the drain current becomes minimum at the Dirac point near 0 V, and the drain current increases regardless of whether the gate voltage is swept to minus side or plus side.

Consequently, it has been proved that a graphene device can be manufactured using the method according to the invention.

While the embodiments and Examples of the invention have been described specifically, the invention is not limited to these embodiments or Examples but can be changed or modified in various manners based on a technical idea of the invention.

For example, although the embodiment has been described in terms of the case in which an electric field effect transistor is manufactured by using a graphene substrate, the invention is not limited to this, but other semiconductor devices in the electronics field, such as logic circuits, memory cell circuits, and AD (analog-digital) converters can also be manufactured.

This application is based upon and claims the benefit of priority from Japanese Patent Application No. 2010-247122, filed Nov. 4, 2010, the disclosure of which is incorporated herein in its entirety by reference.

The invention claimed is:

1. A manufacturing method of a graphene substrate comprising:
   (a) heating a metal layer and a carbide layer with the metal layer placed in contact with the carbide layer to dissolve carbon in the carbide layer into the metal layer; and
   (b) cooling the metal layer and the carbide layer to deposit the carbon in the metal layer as graphene on the surface of the carbide layer.

2. The manufacturing method of a graphene substrate according to claim 1, further comprising:
   (c) removing the metal layer after the (b).

3. The manufacturing method of a graphene substrate according to claim 2, wherein:
   in the (a), the metal layer is interposed between the carbide layer and a heat resistant material layer, and the metal layer and the carbide layer are heated to dissolve carbon in the surface layer of the carbide layer into the metal layer; and
   in the (b), the metal layer and the carbide layer are cooled to deposit carbon in the metal layer as graphene on both of the surface of the carbide layer and the heat resistant material layer.

4. The manufacturing method of a graphene substrate according to claim 3, wherein the heat resistant material layer comprises at least one selected from the group consisting of silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), tungsten carbide (WC), quartz ($SiO_2$), alumina ($Al_2O_3$), sapphire (single crystal $Al_2O_3$), boron nitride (BN), zirconia ($ZrO_2$), and aluminum nitride (AlN).

5. The manufacturing method of a graphene substrate according to claim 1, wherein the carbide layer comprises at least one selected from the group consisting of silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), and tungsten carbide (WC).

6. The manufacturing method of a graphene substrate according to claim 1, wherein the metal layer comprises at least one selected from the group consisting of gallium (Ga), indium (In), thallium (Tl), tin (Sn), lead (Pb), bismuth (Bi), zinc (Zn), and cadmium (Cd).

7. The manufacturing method of a graphene substrate according to claim 1, wherein the heating temperature in the (a) is 800 to 1200° C.

8. The manufacturing method of a graphene substrate according to claim 7, wherein:
   in the (a), the heating temperature is higher than 800° C.; and
   in the (b), the period of time to cool to 800° C. is from 30 to 150 minutes.

9. The manufacturing method of a graphene substrate according to claim 1, wherein in the (a), the metal layer is placed in a holder, the carbide layer is then placed on the metal layer, and the metal layer and the carbide layer are heated to dissolve carbon in the carbide layer into the metal layer.

10. The manufacturing method of a graphene substrate according to claim 1, wherein in the (a), the substrate is placed in a holder, a frame is placed on the substrate, the metal layer is placed in the frame, a second substrate is placed thereon, and the metal layer, the carbide layer, and the second substrate are heated to dissolve carbon in the carbide layer into the metal layer.

11. The manufacturing method of a graphene substrate according to claim 1, wherein the carbide layer comprises a concavo-convex shape.

12. The manufacturing method of a graphene substrate according to claim 11, wherein graphene is segregated on both the projections and recesses of the concavo-convex shape of the carbide layer.

13. The manufacturing method of a graphene substrate according to claim 11, wherein in the (b), graphene is segregated only on the projections of the concavo-convex shape of the carbide layer.

14. The manufacturing method of a graphene substrate according to claim 11, wherein in the (b), graphene is segregated so as to bridge the projections of the concavo-convex shape.

15. A graphene substrate manufactured by the manufacturing method of a graphene substrate according to claim 1.

16. A semiconductor device manufactured using the graphene substrate according to claim 15.

* * * * *

UNITED STATES PATENT AND TRADEMARK OFFICE
CERTIFICATE OF CORRECTION

Page 1 of 1

PATENT NO. : 8,835,286 B2
APPLICATION NO. : 13/882317
DATED : September 16, 2014
INVENTOR(S) : Hidefumi Hiura and Kazuhito Tsukagoshi It is certified that error appears in the above-identified patent and that said Letters Patent is hereby corrected as shown below:

In the Specification

Column 2, Line 49: Delete "c" and insert -- $\varepsilon_0$ --

In the Claims

Column 17, Line 47: In Claim 1, delete "deposit" and insert -- segregate --

Column 17, Line 61: In Claim 3, delete "deposit" and insert -- segregate --

Signed and Sealed this
Twenty-fourth Day of February, 2015

Michelle K. Lee
*Deputy Director of the United States Patent and Trademark Office*